(12) United States Patent
Buechel et al.

(10) Patent No.: US 7,985,966 B2
(45) Date of Patent: Jul. 26, 2011

(54) ELECTRO-OPTICALLY ACTIVE ORGANIC DIODE WITH SHORT PROTECTION

(75) Inventors: Michael Buechel, Eindhoven (NL); Edward Willem Albert Young, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 250 days.

(21) Appl. No.: 12/373,766

(22) PCT Filed: Jul. 12, 2007

(86) PCT No.: PCT/IB2007/052790
§ 371 (c)(1),
(2), (4) Date: Jan. 14, 2009

(87) PCT Pub. No.: WO2008/010165
PCT Pub. Date: Jan. 24, 2008

(65) Prior Publication Data
US 2009/0309095 A1  Dec. 17, 2009

(30) Foreign Application Priority Data

Jul. 19, 2006  (EP) .................................. 06117444

(51) Int. Cl.
*H01L 21/08* (2006.01)
(52) U.S. Cl. .......................................... 257/40; 257/103
(58) Field of Classification Search .................... 257/40, 257/103
See application file for complete search history.

(56) References Cited

U.S. PATENT DOCUMENTS

| 5,739,545 | A | 4/1998 | Guba et al. |
| 6,198,219 | B1 | 3/2001 | Arai et al. |
| 6,433,355 | B1 * | 8/2002 | Riess et al. ..................... 257/40 |
| 6,525,466 | B1 | 2/2003 | Jabbour et al. |
| 2002/0145380 | A1 | 10/2002 | Aziz et al. |
| 2003/0151360 | A1 | 8/2003 | Fukunaga et al. |
| 2006/0145603 | A1 * | 7/2006 | Taniguchi et al. ............ 313/506 |

FOREIGN PATENT DOCUMENTS

| EP | 1003229 A1 | 5/2000 |
| EP | 1137327 A1 | 9/2001 |
| EP | 1651011 A1 | 4/2006 |

OTHER PUBLICATIONS

Soon Moon Jeong et al; "Improved Stability of Organic Light-Emitting Diode With Aluminum Cathodes Prepared by Ion Beam Assisted Deposition", Science and Technology of Advanced Materials, vol. 6, 2005, pp. 97-102.

* cited by examiner

*Primary Examiner* — Zandra Smith
*Assistant Examiner* — Paul E Patton

(57) ABSTRACT

An electro-optically active organic diode, for example an organic light emitting diode (OLED), comprises an anode electrode (102), a cathode electrode (122) and an electro-optically active organic layer (110) arranged in-between. A cover layer (124) is arranged in contact with a surface of the cathode layer (122) so that the cathode layer (122) is positioned between the organic layer (110) and the cover layer (124), which is formed of a substantially inert material with respect to a cathode layer (122) material in contact with said cover layer (124). The inert material is deposited on said surface of the cathode layer (122) so that the complete surface is covered and surface defects eliminated. A short protection layer (120) is further arranged between said cathode electrode (122) and said electro-optically active organic layer (110), and adjacent to said cathode electrode (122), and is formed of an inorganic semiconductor material. The cover layer (124) and the short protection layer (120) together reduce the risk of shorts to occur between the cathode (122) and the anode (102) and thus increase reliability of the electro-optically active organic diode.

14 Claims, 2 Drawing Sheets

ELECTRO-OPTICALLY ACTIVE ORGANIC DIODE WITH SHORT PROTECTION

This application is a national stage application under 35 U.S.C. §371 of International Application No. PCT/IB2007/052790 filed on Jul. 12, 2007, and published in the English language on Jan. 24, 2008, as International Publication No. WO/2008/010165, which claims priority to European Application No. 06117444.7, filed on Jul. 19, 2006, incorporated herein by reference.

FIELD OF THE INVENTION

The present invention relates generally to electro-optically active organic diodes, such as used in organic solar cells and as organic light emitting diodes (OLEDs). More specifically it relates to an electro-optically active organic diode that comprises an anode electrode, a cathode electrode and an electro-optically active organic layer arranged between said electrodes.

BACKGROUND OF THE INVENTION

Electro-optically active organic diodes are for example used as organic light emitting diodes (OLEDs), in lightning devices, in display devices and in organic solar cell devices. An organic diode in an organic solar cell device is arranged to generate electricity from light, whilst in a lightning device, the organic diode is arranged to generate light from electricity. Nevertheless, these are just different manifestations of common fundamental properties pertaining to certain electro-optically active organic materials. Progress and development in one area, such as in the area of lightning devices and OLEDs, thus can be utilized for improvements in the other area, such as in the area of organic solar cell devices.

This far, efforts have mostly been spent on devices for generation of light, and in particular on OLEDs. This is partly owing to that the obtainable efficiency, reliability and operational lifetime so far have been considered too poor for viable organic solar cell devices, especially in light of what can be achieved in conventional solar cell devices. Although these properties are desirable to improve also in the area of lightning application devices, the requirements are often not fully as high, and there are already commercially available products, such as displays based on OLED technology. Partly, this is owing to that OLEDs emit light and thus do not require backlighting such as in conventional liquid crystal displays (LCDs). Some other advantages of electro-optically active organic diodes in general are for example that they are comparatively easy and cost efficient to make, can be fabricated in thin, flexible layers and even be made transparent.

Recent electro-optically active organic diodes have shown great progress, especially in efficiency and lifetime, however the increased lifetime has in some cases lead to problems with reliability. Reliability is a problem in general in the area of electro-optically active organic diodes and there is a general need for improved operational life times. Although many of the desired and beneficial properties are owing to the organic nature, there are also some drawbacks that follow from this, for example, organic materials are in general more sensitive to harsh physical treatments and high temperatures compared to many inorganic materials.

One known reason for reliability problems is a reactive cathode. In order to be electron injecting and efficient, low work function electrode materials are typically desired. These, however, are by nature reactive. As a result, cathode materials having a higher work function, but worse efficiency, have been used instead, for example aluminum (Al), which is environmentally stable and also has the advantage of being a known and well explored conducting material from the conventional semiconductor industry. In order to improve efficiency, such higher work function cathode layers sometimes are furnished with an additional thin inorganic injection layer, for example of lithium fluoride (LiF) arranged between the cathode layer and the electro-optically active organic layer.

U.S. Pat. No. 6,525,466 presents an OLED that claims to be reliable and that not to require an injection layer. The OLED consists of a cathode of a mixture, alloy or composite, of a metal and an insulator, for example Al and LiF, which is in contact with the electro-optically active organic layer. For environmental protection there is an optional, conducting capping layer of Al on top of the cathode, i.e. so that the cathode is located between the electro-optically active organic layer and the capping layer.

In conclusion, in the prior art, there exist and are proposed a number of ways to improve reliability and enhance life time in electro-optically active organic diodes, however, there is still a need for further improvements.

SUMMARY OF THE INVENTION

It is an object of the present invention to overcome or at least alleviate problems in the prior art. A specific object is to improve reliability of electro-optically active organic diodes. The invention is defined by the appended independent claims. Preferred embodiments are set forth in the dependent claims and in the following description and drawings.

Although there is no wish to be bound by any particular theory, the invention is partly based on the discovery that one large contributor to unreliable conventional electro-optically active organic diodes, and especially such of large areas, seems to be shorts that occur between cathode and anode electrodes, and the extent of damage such shorts have on the organic material arranged in between. It further seems like one factor contributing to these shorts is the occurrence of high field strengths in the cathode owing to unintentional physical defects in the cathode, especially defects having sharp edges, which can give rise to very high, local field strengths. The sharp edges may for example be located at pinholes or at a rough or damaged (e.g. due to undesired presence of particles), or in any other way defect, surface of the cathode. A result from increased field strength may be locally raised temperatures and sometimes softening and melting cathode material. Since the organic materials used in electro-optically active organic diodes, and organic materials in general, only can withstand comparatively low temperatures and often have a comparatively low melting/pyrolysis temperature, the raised temperatures may cause the electro-optically active organic layer material to degrade and/or soften, which in combination with the often high electrostatic pressure of many bars between cathode and anode, seem to increase the risk of damaged organic material and a short to occur between the cathode and anode through the organic material, typically at spots where the electro-optically active organic layer, for example due to the above reason, has become very thin or damaged in any other way. As a result there can be relatively high currents, which lead to even higher temperatures and greater damage.

Hence, the above-mentioned and other objects that will be evident from the following description, are achieved by an electro-optically active organic diode comprising an anode electrode layer, a cathode electrode layer, an electro-optically active organic layer arranged between said electrodes. A cover layer is arranged in contact with a surface of the cathode layer so that the cathode layer is positioned between the electro-optically active organic layer and the cover layer, said cover layer is formed of a substantially inert material with respect to a cathode layer material in contact with said cover layer, and said inert material is deposited on said surface of the cathode layer so that the complete surface is covered and surface defects eliminated. A short protection layer is further arranged between said cathode electrode layer and said electro-optically active organic layer, and adjacent to said cathode electrode layer, wherein said short protection layer is formed of an inorganic semiconductor material.

"Electro-optically active" here refers to the ability to transform light to electricity, and/or electricity to light. When it is used to describe a layer it typically means that the layer comprises a material, for example in form of a sub-layer, that has this ability and when used to describe a diode it typically means that the layer comprises a material, for example in form of a layer, that has this ability, which for example is the case for an organic light emitting diode (OLED).

An "anode electrode" typically is an electrode for hole injection, e.g. in the form of a base layer deposited on a carrier or substrate.

A "cathode electrode" typically is an electrode for electron injection, e.g. in the form of a deposited top layer.

When the cover layer is deposited and covers the cathode surface, surface defects, such as pin holes, other voids and sharp defects, become filled and covered, and the risk of high field strengths to occur at such defects is reduced. This reduces the risk of conditions that may lead to a short. In case there is still a situation of an imminent short, the short protection layer, which prevents direct contact between the cathode layer and the organic layer, reduces the risk of detrimental impact on the organic layer and the risk of a short to occur between the cathode and the anode. Hence, the cover layer and the short protection layer together reduce the risk of shorts to occur and thus increase reliability of the electro-optically active organic diode. Inorganic materials are typically not as sensitive as organic materials and it are thus better suited for protective purposes. Moreover, semiconductor materials typically has good transparency, which is a desirable property for a layer arranged between the cathode electrode and organic layers.

The short protection layer may be conducting. When the inorganic semiconductor forms the short protection layer, i.e. typically after being deposited by thermal evaporation, the layer is typically conducting, although less conducting than the cathode, and in spite of that the material used per se is a semiconductor. Being conductive allows for thicker layers, which is beneficial for protection purposes. Better conductivity typically means that thicker layers are possible and thus better short protection. The thickness can be used to achieve a conduction that is beneficial for reducing currents that tend to increase and be detrimental in a situation of an imminent short.

The inorganic semiconductor material preferably has a higher melting temperature than the material of the cathode layer. This allows the organic diode to better withstand a situation where heat is developed that risks to melt the electrode material. A short protection layer that remains intact and rigid in such a situation further protects the organic layer from getting in direct contact with the electrode material and distributes the force and pressure exerted on the organic layers over a large surface, which reduces the risk of compressed and damaged organic layers.

The inorganic semiconductor material may have a band gap greater than 2.7 eV, and preferably greater than 3 eV. This means that blue electroluminescence may not be absorbed and that thus generation of photoelectrons are not possible at an interface between the short protection layer and the organic layer. Further, the short protection layer will be stable against hot electrons that may be generated at the interface between the short protection layer and the cathode layer. Photoelectrons are thermalised in the short protection layer and thus may not damage the organic layer. An advantageous side effect with a band gap greater than about 2.7 eV is that the short protection layer also will serve as a exciton blocking layer.

The inorganic semiconductor material may have an electron affinity between 0.5 eV and 3.5 eV. This can adapt and minimize the injection barrier for electrons into the lowest unoccupied molecular orbital (LUMO) of the organic layer, and the short protection layer may additionally act as an electron injection layer.

The inorganic semiconductor material may have a dielectric constant greater than 1, preferably greater than 10, and more preferably greater than 30. Materials of a high dielectric constant reduces the field strength at for example sharp edges of a defect and thus help to decrease the risk of high field strengths that ultimately may lead to a short.

The inorganic semiconductor material may comprise a chalcogenide or binary oxide of an alkali earth metal or lanthanide, preferably BaO, BaSe, $La_2O_3$ or $Ce_2O_3$.

The short protection layer may have a thickness of at least 50 Å, preferably above 200 Å. The cover layer may be conducting and/or be of a material that has a dielectric constant greater than 1, preferably greater than 10, and more preferably greater than 30.

The cover layer may comprise a glue, preferably of epoxy or acrylic type and/or a thin film packaging material, preferably silicon nitride (SiN), silicon carbide (SiC), silicon dioxide ($SiO_2$) or aluminum oxide ($Al_2O_3$).

The organic diode may further comprise a second cover layer arranged on the cover layer.

There may be a lightning device, such as a lamp, a display device or an organic solar cell device, which comprises the electro-optically active organic diode.

BRIEF DESCRIPTION OF THE DRAWINGS

This and other aspects of the present invention will now be described in more detail, with reference to the appended drawings showing currently preferred embodiments of the invention.

FIG. 2a schematically shows, by way of example, a cross-sectional view of a bilayer electro-optically active organic layer in an electro-optically active organic diode as of FIG. 1.

FIG. 2b schematically shows a cross-sectional view of a bilayer that is an alternative to the organic layer showed in FIG. 2a.

DESCRIPTION OF PREFERRED EMBODIMENTS

Figure 1:
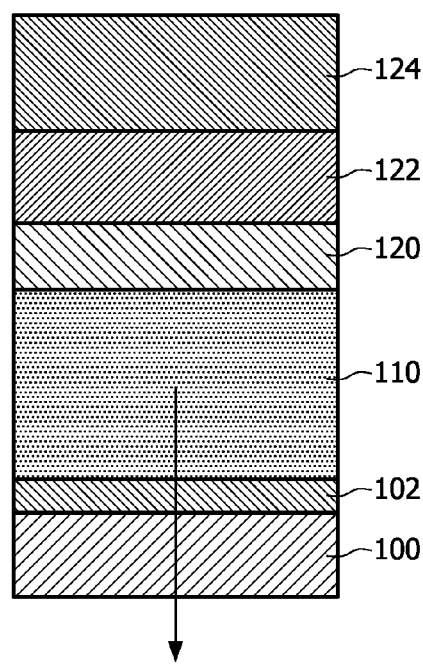
FIG. 1 schematically shows a cross-sectional view of layers in an electro-optically active organic diode according to an embodiment.

FIG. 1 schematically shows a cross-sectional view of layers in an electro-optically active organic diode according to an embodiment. The organic diode comprises a substrate 100, an anode layer 102, an electro-optically active organic layer 110, an inorganic short protection layer 120, a cathode layer 122 and a cover layer 124.

The substrate 100 is typically transparent and may for example be made of a ceramic, e.g. glass or silicon, a plastic or a metal. The substrate may be rigid or flexible.

The anode layer 102 is a hole-injecting layer, typically of a relatively high work function and electrically conducting material, and is typically transparent in order to let light through, which is indicated by an arrow in FIG. 1. One currently predominant example of a transparent material suitable for the anode layer is indium tin oxide (ITO). Other examples include metals, metal oxides, doped inorganic semiconductors, doped conducting polymers or small molecules etc. The thickness of the anode layer 102 is typically in the range of about 100 Å to 3000 Å. The anode layer 102 may be deposited on the substrate 100 by any of a variety of depositing techniques for thin films known in the art, for example, vacuum evaporation, sputtering, electron beam deposition or chemical vapor deposition.

The electro-optically active organic layer 110 may comprise sub layers, but at least one active, emissive/absorbing layer for transformation of electricity to/from light. The total thickness of the organic layer 110 may be above about 500 Å, but preferably above 1000 Å. A thicker electro-optically active organic layer means more margin and more material that needs to be damaged before a short may occur. In order to compensate for a rough underlying surface, for example an ITO substrate, the organic layer typically need to be above a certain thickness. A smoother underlying layer in general allows for a thinner organic layer.

Structure and materials of the organic layer 110 will be further discussed in connection with FIGS. 2a and 2b.

In FIG. 1, an arrow indicates that light is emitted from the organic layer 110 and that light passes out through the anode 102 and substrate 100. It may be noted that in alternative embodiments, the emitted light instead is let out through a transparent cathode or through both cathode and anode, and in other alternative embodiments there may instead be absorption of light.

The short protection layer 120 is of an inorganic semiconductor material that may have an electron affinity between about 0.5 eV and about 3.5 eV, a band gap greater than about 2.6 eV, and preferably greater than about 3 eV and a melting point that is higher than the melting point of the cathode layer 122 material.

Materials that have been found to be suitable for the short protection layer 120 are, for example, included in the chalcogenides or binary oxides of alkali earth metals or lanthanides, for example barium oxide (BaO), barium selenide (BaSe), lanthanum oxide ($La_2O_3$) and cerium oxide ($Ce_2O_3$). When the exemplified materials are forming the short protection layer 120, e.g. after being deposited by thermal evaporation, there are typically vacancies of O or Se, and thus oxygen deficiency or selenium deficiency, which may be one reason behind that the short protection layer, although formed of per se undoped semiconductor materials, exhibit a conductivity that allow for comparatively thick layers.

Other examples may include mixtures involving chalcogenides and/or binary oxides of alkali earth metals, or lanthanides, or mixtures of chalcogenides and/or binary oxides of alkali earth metals with low electron affinity metals, such as alkali metals, alkali earth metals and/or lanthanides.

The dielectric constant of the inorganic semiconductor material may be greater than 1, for example greater than 10 or even 30. BaO, for example, has a dielectric constant of about 34. The thickness of the short protection layer 120 may be in the range of about 10 Å to 50 000 Å, preferably in the range of about 50 Å to 10 000 Å, and typically in the range of about 100 Å to 1000 Å. Often a thickness of at least 200 Å is desired.

When the short protection layer 120 is deposited on the organic layer 110, this should be done in a way that is non-detrimental for the organic layer. Such methods for depositing the short protection layer 120 include, for example, thermal evaporation. In case of a binary oxide of an alkali earth metal or lanthanide, such as BaO, $La_2O_3$ and $Ce_2O_3$, the short protection layer 120 may be created by first depositing the alkali earth metal or lanthanide, for example by thermal evaporation, and then perform an in situ oxidation, for example by dosing oxygen into a vessel that has been used for the evaporation, to transform the alkali earth metal or lanthanide into a corresponding binary oxide. This may be particularly useful when the temperature needed for direct thermal evaporation of the binary oxide are very high. The cathode layer 122 is typically a metallic material or a metal and may be a material having a comparatively low work function. However, in order to be environmentally stable and less reactive, typically a material is selected that has higher work function and is more stable, or a low work function material may be alloyed or combined with a more stable material. Examples of materials of a low work function are calcium (Ca), Magnesium (Mg) and Barium (Ba). Examples of materials of higher work function, but that are more stable, are aluminum (Al), copper (Cu) or silver (Ag). When light is to be passed via the anode and not via the cathode, the material of the cathode should typically be a good mirror, i.e. be reflective to the light in question. For example, Al and Ag is considered as good mirror materials in this context. A not so low work function of the cathode may to some extent be compensated for by the short protection layer 120, which additionally may act as a electron injecting layer.

The thickness of the cathode layer 122 may be in the range of about 300 to 10000 Å. The cathode layer 122 may be deposited on the short protection layer 120 by any one of a number of conventional techniques including for example thermal evaporation.

The cover layer 124 is preferably of a different but substantially chemically inert material with respect to the material of the cathode layer 322. The cover layer 124 is typically deposited on and completely covers one layer surface of the cathode layer 322. Sharp edge defects, such as pin holes, voids and other defects and damages in the cathode layer 322 surface can be covered and filled by the cover layer 124. One common cathode material that often is impaired by surface defects is Al. The material of the cover layer 124 may have a high dielectric constant that is greater than 1, for example greater than 10 or even 30. It may further be conductive.

In practice it has turned out that desired covering and filling properties of the cover layer 124, which eliminates surface defects and their detrimental impact, can be reached by one of many different materials, inorganic and organic, typically vapor phase deposited. Nevertheless, the materials are preferably thin film packaging materials or glues. Examples of thin film packaging materials are silicon nitride (SiN), silicon carbide (SiC), silicon dioxide ($SiO_2$) and aluminum oxide ($Al_2O_3$), typically deposited by plasma enhanced vapor deposition (PECVD), such as inductively coupled PECVD (IC-PECVD). Glues are preferably of epoxy-type, typically room temperature curable using two solutions, or UV-curable adhesives, typically one solution of epoxy or acrylic type. When a glue is used, the filling and covering properties can be enhanced by reducing viscosity of the glue when it is applied, e.g. by heating to above room temperature, for example 70° C.

In addition to its filling and covering properties, the cover layer 124 may have environmental protection properties, for example by being inert to oxygen and humidity and thus protect the inner layers, e.g. the cathode layer 322 and the short protection layer 320, from these or other substances that can be detrimental but likewise hard to avoid in environments of manufacturing or use.

Generally, the thickness of the cover layer 124 is not critical as long as there is enough material deposited to fill defects and cover the cathode layer 322 surface. However, the thickness may be about 1000 Å or more.

Figures 2A, 2B:
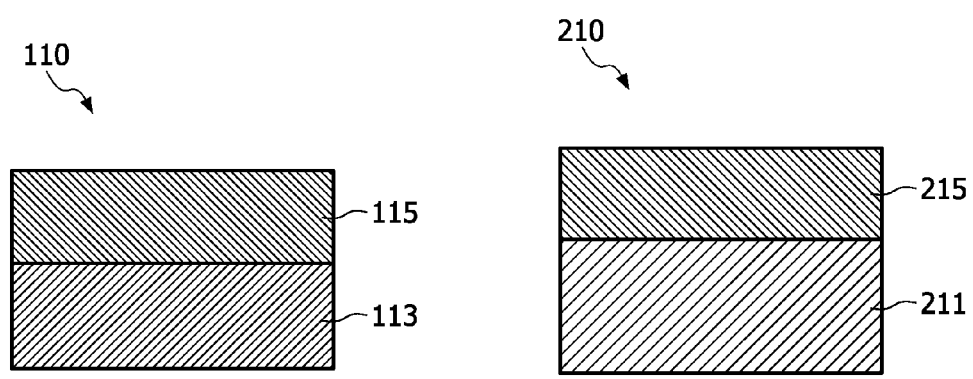

FIG. 2a schematically shows, by way of example, a cross sectional view of the electro-optically active organic layer 110. The electro-optically active organic layer 110 here has a bilayer structure and comprises a hole-transporting layer 113 (HTL), for example of N,N'-diphenyl-N,N'-bis(1-naphthyl)-1,1'biphenyl-4,4"diamine (aNPD) and a combined electron-transporting and emissive layer 115 (ETL/EML), for example of $Alq_3$. The exemplified structure is per se known and is used in conventional OLEDs. It is an example of a so called small molecule structure. An OLED employing such a structure may be termed a small molecule light emitting diode (smoLED or SM-LED). The organic layers 113, 115 are in a smoLED typically deposited by thermal evaporation or organic vapor phase deposition.

In addition to what has been presented here, it should be understood that a smoLED electro-optically active organic layer 110 may comprise more or less layers, and layers of other organic materials, for example such as are used in conventional smoLEDs.

FIG. 2b schematically shows a cross sectional view of an electro-optically active organic layer 210 that has another bilayer composition than the electro-optically active organic layer 110 of FIG. 2a. The organic layer 210 here comprises an organic HIL 211, for example of poly(3,4-ethylenedioxythiophene) (PEDOT) and a combined ETL/EML 215, for example of polyfluorene (PF). The exemplified structure is per se known and is used in conventional OLEDs. It is an example of a so called large molecule, or polymer structure. An OLED employing such a structure may be termed a polymer light emitting diode (polyLED or PLED). The organic layers 211, 215 are in a polyLED typically deposited by spin-coating or printing techniques.

In addition to what has been presented here, it should be understood that a polyLED organic layer may comprise more or less layers, and layers of other organic materials, for example such as are used in conventional polyLEDs.

Hence, it should be understood that the present invention is not dependent on any particular electro-optically active organic layer, electro-optically active organic layer structure, composition or material of the electro-optically active organic layer, but that the principles of the invention are applicable and compatible to the vast majority of electro-optically active organic layers such as used in conventional OLEDs and other electro-optically active organic diodes.

Figure 3:
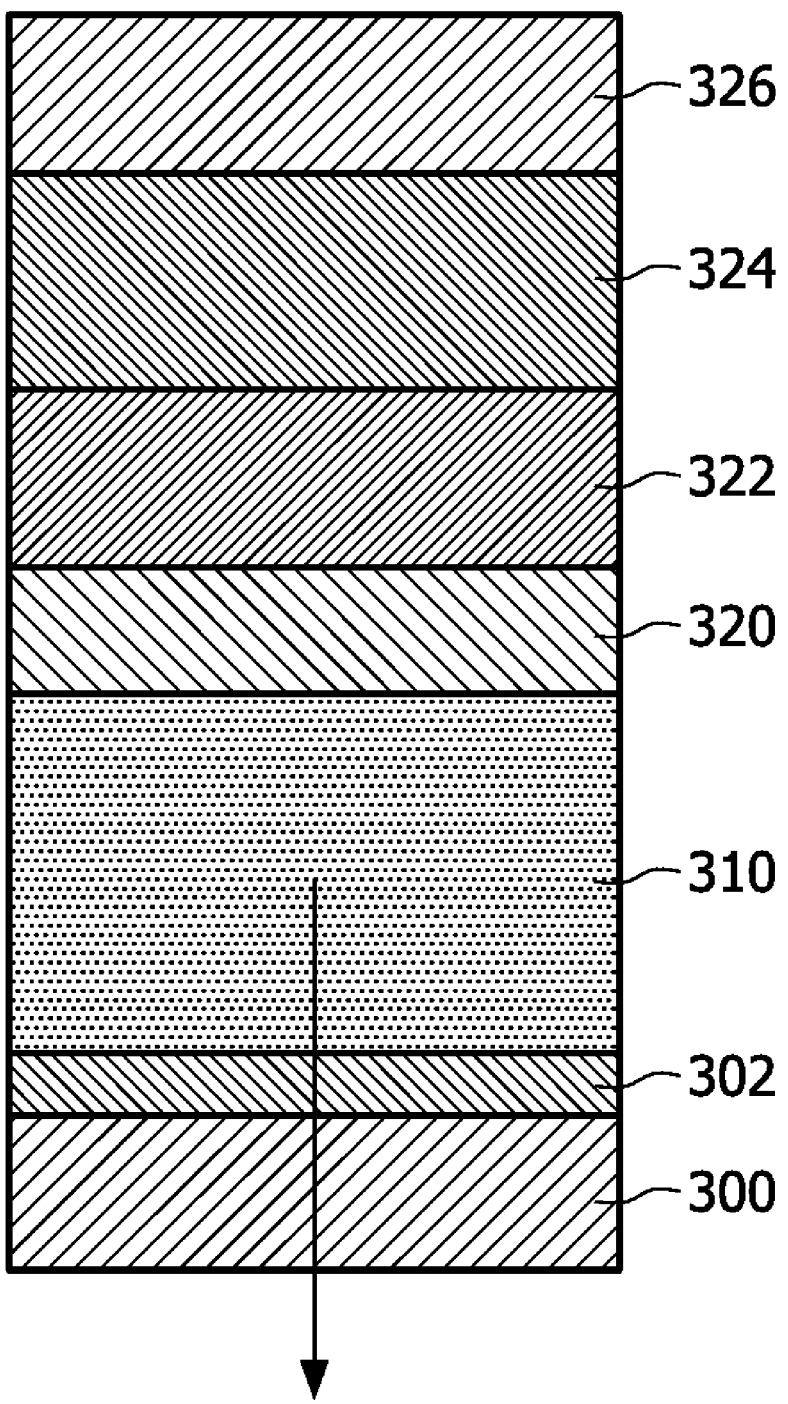
FIG. 3 schematically shows a cross-sectional view of layers in an electro-optically active organic diode according to another embodiment.

FIG. 3 schematically shows a cross-sectional view of layers in an electro-optically active organic diode according to an embodiment where there is a second cover layer 326 deposited on and covering the cover layer 324. The remaining layers 300, 302, 310, 320 and 322, correspond to the respective layers 100, 102, 110, 120 and 122 of the embodiment presented in connection with FIG. 1. The second cover layer 326 is typically an environmental protection layer of a material that is chemically inert with respect to the cover layer 324 and environmentally stable and resistant, in particular to oxygen, humidity and other atmospheric substances which can be hard to completely avoid in a use and production environment. When a glue is used for the cover layer 324, the glue may additionally be used for attaching the second cover layer 326, for example a glued glass cover lid as protection against, for example, in-diffusion of water.

Other examples of materials of the second cover layer 326 are metals, organic hydrophobic materials, such as perfluorinated oils, and glues (e.g. epoxy) with or without getters for water.

An electro-optically active organic diode according to the present invention may be used in a lightning device, an organic solar cell device, it can be an organic light emitting diode (OLED) and can be used in a lamp, in a display device, for example in a flat TV, a computer monitor, a digital camera, a mobile phone, and a vast number of other electronic gizmos.

Some more specific embodiments will now be exemplified.

In a first example, an OLED comprises a 150 nm ITO layer deposited on a glass substrate, followed by a 100 nm aNPD layer and a 80 nm $Alq_3$ layer. A 20 nm BaO layer is deposited on the $Alq_3$ layer and is followed by a 100 nm Al layer. An evaporated 20nm $Alq_3$ layer covers the Al layer and eliminates defects in its surface. A vessel used for Al evaporation was vented before evaporation of the $Alq_3$ layer.

In a second example, an OLED comprises a 150 nm ITO layer deposited on a glass substrate, followed by a 100 nm aNPD layer and a 80 nm $Alq_3$ layer. A 20 nm BaO layer is deposited on the $Alq_3$ layer and is followed by a 100 nm Al layer. A spin-coated 100 nm PEDOT layer, which has been dried in a vacuum oven for 15 minutes, covers the Al layer and eliminates defects in its surface.

In a third example, an OLED comprises a 150 nm ITO layer deposited on a glass substrate, followed by, a 100 nm aNPD layer and a 80 nm $Alq_3$ layer. A 20 nm BaO layer is deposited on the $Alq_3$ layer and is followed by a 100 nm Al layer. A 100 nm PECVD deposited SiN layer covers the Al layer and eliminates defects in its surface.

In a fourth example, an OLED comprises a 150 nm ITO layer deposited on a glass substrate, followed by a 100 nm aNPD layer and a 80 nm $Alq_3$ layer. A 20 nm BaO layer is deposited on the $Alq_3$ layer and is followed by a 100 nm Al layer. A 300 nm PECVD deposited SiN layer covers the Al layer and eliminates defects in its surface. A second cover layer of an epoxy glue is deposited on the SiN layer. A glass sheet is arranged on the glue layer.

In a fifth example, an OLED comprises a 150 nm ITO layer deposited on a glass substrate, followed by a 100 nm aNPD layer and a 80 nm $Alq_3$ layer. A 20 nm BaO layer is deposited on the $Alq_3$ layer and is followed by a 100 nm Al layer. A 30 nm Cr layer covers the Al layer and eliminates defects in its surface, and a 100 nm Al layer is deposited on the Cr layer.

In a sixth example, an OLED comprises a 150 nm ITO layer deposited on a glass substrate, followed by a 100 nm aNPD layer and a 80 nm $Alq_3$ layer. 6 nm Ba is deposited by evaporation on the $Alq_3$ layer. After evaporation, oxygen is dosed into the vessel (10-5 mbar for 2 min). Then, again 6 nm Ba is evaporated and exposed to oxygen. This is followed by a 100 nm Al layer. A 100 nm PECVD deposited SiN layer covers the Al layer and eliminates defects in its surface.

The person skilled in the art realizes that the present invention by no means is limited to the embodiments and examples described above. On the contrary, many modifications and variations are possible within the scope of the appended claims.

The invention claimed is:

1. An electro-optically active organic diode, comprising:
   an anode electrode layer;
   a cathode electrode layer;
   an electro-optically active organic layer arranged between said electrode layers;
   a cover layer arranged in contact with a surface of the cathode electrode layer so that the cathode electrode layer is positioned between the electro-optically active organic layer and the cover layer, said cover layer comprising a substantially inert material with respect to a cathode layer material in contact with said cover layer, said inert material being deposited on said surface of the cathode electrode layer, wherein the cover layer is conducting; and
   a conducting short protection layer arranged between said cathode electrode layer and said electro-optically active organic layer, and adjacent to said cathode electrode layer, wherein said short protection layer comprises an inorganic semiconductor material and has a thickness of at least 200 Å.

2. The organic diode as claimed in claim 1, wherein the inorganic semiconductor material has a higher melting temperature than the material of the cathode layer.

3. The organic diode as claimed in claim 1, wherein the inorganic semiconductor material has a band gap greater than 2.7 eV.

4. The organic diode as claimed in claim 1, wherein the inorganic semiconductor material has an electron affinity between 0.5 eV and 3.5 eV.

5. The organic diode as claimed in claim 1, wherein the inorganic semiconductor material has a dielectric constant greater than 1.

6. The organic diode as claimed in claim 1, wherein the inorganic semiconductor material comprises a chalcogenide or binary oxide of an alkali earth metal or lanthanide.

7. The organic diode as claimed in claim 1, wherein the cover layer comprises a glue.

8. The organic diode as claimed in claim 1, wherein the cover layer comprises a thin film packaging material.

9. The organic diode as claimed in claim 1, further comprising a auxiliary cover layer arranged on the cover layer.

10. The organic diode as claimed in claim 1, wherein the inorganic semiconductor material has a dielectric constant greater than 10.

11. The organic diode as claimed in claim 6, wherein the inorganic semiconductor material comprises a BaO, BaSe, $La_2O_3$ or $Ce_2O_3$.

12. The organic diode as claimed in claim 1, wherein the cover layer comprises a silicon nitride (SiN), silicon carbide (SiC), silicon dioxide ($SiO_2$) or aluminum oxide ($Al_2O_3$).

13. An electro-optically active organic diode, comprising:
   an anode electrode layer;
   a cathode electrode layer;
   an electro-optically active organic layer arranged between said electrode layers;
   a cover layer arranged in contact with a surface of the cathode electrode layer so that the cathode electrode layer is positioned between the electro-optically active organic layer and the cover layer, said cover layer comprising a substantially inert material with respect to a cathode layer material in contact with said cover layer, said inert material being deposited on said surface of the cathode electrode layer;
   a auxiliary cover layer arranged on the cover layer; and
   a conducting short protection layer arranged between said cathode electrode layer and said electro-optically active organic layer, and adjacent to said cathode electrode layer, wherein said short protection layer comprises an inorganic semiconductor material and has a thickness of at least 200 Å.

14. An electro-optically active organic diode, comprising:
   an anode electrode layer;
   a cathode electrode layer;
   an electro-optically active organic layer arranged between said electrode layers;
   a cover layer arranged in contact with a surface of the cathode electrode layer so that the cathode electrode layer is positioned between the electro-optically active organic layer and the cover layer, said cover layer comprising a substantially inert material with respect to a cathode layer material in contact with said cover layer, said inert material being deposited on said surface of the cathode electrode layer, wherein the cover layer includes a silicon nitride (SiN), silicon carbide (SiC), silicon dioxide($SiO_2$) or aluminum oxide $Al_2O_3$; and
   a conducting short protection layer arranged between said cathode electrode layer and said electro-optically active organic layer, and adjacent to said cathode electrode layer, wherein said short protection layer comprises an inorganic semiconductor material and has a thickness of at least 200 Å.

* * * * *